United States Patent
K et al.

(10) Patent No.: US 8,004,287 B2
(45) Date of Patent: Aug. 23, 2011

(54) METHOD OF DETECTING THE WET ARC FAULT IN THE AC POWER DISTRIBUTION APPLICATIONS

(75) Inventors: Prashant Purushotham Prabhu K, Bangalore (IN); Sanjay Kumar Chaudhary, Aalborg (DK); Zhenning Liu, Mississauga (CA)

(73) Assignee: Honeywell International Inc., Morristown, NJ (US)

( * ) Notice: Subject to any disclaimer, the term of this patent is extended or adjusted under 35 U.S.C. 154(b) by 342 days.

(21) Appl. No.: 12/395,402

(22) Filed: Feb. 27, 2009

(65) Prior Publication Data

US 2010/0219838 A1  Sep. 2, 2010

(51) Int. Cl.
*G01R 31/08* (2006.01)
(52) U.S. Cl. .......... 324/536; 324/512; 324/524; 361/42; 702/58
(58) Field of Classification Search .................. None
See application file for complete search history.

(56) References Cited

U.S. PATENT DOCUMENTS

| | | | |
|---|---|---|---|
| 5,839,092 A * | 11/1998 | Erger et al. | 702/58 |
| 6,522,509 B1 | 2/2003 | Engel et al. | |
| 6,625,550 B1 | 9/2003 | Scott et al. | |
| 7,391,218 B2 | 6/2008 | Kojori et al. | |
| 7,864,492 B2 * | 1/2011 | Restrepo et al. | 361/42 |
| 2006/0203401 A1 * | 9/2006 | Kojori et al. | 361/42 |
| 2007/0188947 A1 | 8/2007 | Sung | |
| 2008/0129307 A1 | 6/2008 | Yu et al. | |

* cited by examiner

*Primary Examiner* — Minh N Tang
(74) *Attorney, Agent, or Firm* — Miriam Jackson, Esq.

(57) ABSTRACT

Methods for detecting wet arc faults are based on the direct current (DC) signature analysis and pattern matching pertaining to wet arc characteristics. While magnifying some wet arc fault signatures, it may be found that the wet arc current signal itself resembles a normal current signal in both time and frequency domains. The change in magnitude or high frequency behavior found may not be enough to distinguish a wet arc fault signature from a normal signature. Embodiments of the present invention may look at the magnitude change in the DC content per cycle of the wet arc current signal, which may be more positive in one cycle while, in the next cycle, it may be negative in a relative manner. A particular number of these changes may be determinative of a wet arc fault.

17 Claims, 4 Drawing Sheets

US 8,004,287 B2

METHOD OF DETECTING THE WET ARC FAULT IN THE AC POWER DISTRIBUTION APPLICATIONS

BACKGROUND OF THE INVENTION

The present invention relates to methods of detecting wet arc faults and more particularly, methods of detecting wet arc faults in AC power distribution applications.

A wet arc signature may be defined as a "high impedance fault" because the impedance found in wet arc faults may be comparatively very high during the arcing event. As a result, the arc produced is very small in magnitude but yet very dangerous.

The wet arc can be observed in moist environments where the salt concentration is comparatively very high. Sea water has a typical concentration of 3% to 4% of sodium chloride (NaCl). In a typical aircraft environment, moisture available in the air may get condensed and deposit on the wires as water droplets having a certain NaCl concentration. Since the aircraft goes in different forms of stress and vibrations in its life cycle, the wires, over time, rub against each other, causing these water droplets to settle at the sharp edges. Also, in some older aircraft, wires have the property that they may absorb the water droplets. As a result, the wiring strength is reduced over time.

Since the wires in aircraft are typically present in a bundle, these water droplets make their way into the bundle and may produce a continuous/discontinuous channel between any two conductors. The path which is formed is called "tracking". Over time, the water droplets evaporate but the salt concentration still remains. Upon further water condensation, the channel is produced again. And if the channel produced is a conductive channel making a path between two wires of different electrical potentials, a "wet arc" may result. While this wet arc track may clear immediately, the salt concentration still remains and a new track may be created when the next fresh water droplets condense. Overall, the formation of wet arc faults is a slow process, but yet there is a source of energy which is always created, and over some course of time, this can create a major impact.

As can be seen, there is a need for a method for detecting wet arc faults so that damage caused by wet arc faults, over time, may be mitigated.

SUMMARY OF THE INVENTION

In one aspect of the present invention, a method for detecting arc faults comprises measuring a direct current (DC) content of an alternating current (AC) waveform over a number of AC power cycles; determining a magnitude change number, the magnitude change number being the number of times the magnitude of the DC content per cycle changes from positive to negative and from negative to positive over the number of AC waveforms; and determining the existence of the arc fault when the magnitude change number is at least certain percentage (eg. 10%) of the number of AC waveforms.

In another aspect of the present invention, a method for detecting wet arc faults comprises measuring a DC content of an AC waveform over a number of AC power cycles; determining a slope value, the slope value being a slope of a line connecting two adjacent DC content per cycle values when the DC content per cycle is plotted consecutively on a graph; determining a slope value change number, the slope value change number being the number of times the slope value changes over the number of AC power cycles; and determining the existence of the wet arc fault when the slope value change number is at least certain percentage (e.g. 10%) of the number of AC power cycles.

In a further aspect of the present invention, a method for detecting wet arc faults comprises measuring a DC content per cycle of an AC waveform over a number of AC power cycles; determining a slope value, the slope value being a slope of a line connecting two adjacent DC content per cycle values when the DC content per cycle is plotted consecutively on a graph; determining a slope value change number, the slope value change number being the number of times the slope value changes over the number of AC power cycles; determining a magnitude change number, the magnitude change number being the number of times the magnitude of the DC content per cycle changes from positive to negative and from negative to positive over the number of AC power cycles; and determining the existence of the wet arc fault when the slope value change number and the magnitude change number is at least certain percentage (e.g. 10%) of the number of AC power cycles.

These and other features, aspects and advantages of the present invention will become better understood with reference to the following drawings, description and claims.

DETAILED DESCRIPTION OF THE INVENTION

The following detailed description is of the best currently contemplated modes of carrying out exemplary embodiments of the invention. The description is not to be taken in a limiting sense, but is made merely for the purpose of illustrating the general principles of the invention, since the scope of the invention is best defined by the appended claims.

Various inventive features are described below that can each be used independently of one another or in combination with other features. However, any single inventive feature may not address any of the problems discussed above or may only address one of the problems discussed above. Further, one or more of the problems discussed above may not be fully addressed by any of the features described below.

Broadly, embodiments of the present invention provides methods for detecting wet arc faults based on the DC content per cycle signature analysis and pattern matching pertaining to wet arc characteristics. While magnifying some wet arc fault currents, it may be found that the wet arc current signal resembles a normal current signal. The change in magnitude or high frequency behavior found may not be enough to distinguish a wet arc fault current from a normal current in both time and frequency domains. Exemplary embodiments of the present invention may look at the magnitude change in the DC content per cycle of the wet arc current, which may be more positive in one cycle while, in the next cycle, it may be negative in a relative manner. A particular number of these changes may be determinative of a wet arc fault.

This nature of the wet arc may be useful in exemplary embodiments of the present invention. To understand this nature, wet arc DC template analysis may be useful and may be adopted to determine whether a measured DC magnitude change is greater than a predefined DC magnitude change. A template may be formed thereafter by monitoring this change, taking a few cycles backwards and many cycles forward. For every alternate current cycle of the current waveform, the DC content per cycle may be calculated and captured as a dot in a DC analysis template, as described in greater detail below.

In the lab environment, a wet arc setup was created according to the SAE specification standards. In this setup, a burette was filled with 3% aqueous NaCl solution. The water droplets coming out of the burette were made to fall over two wires which have a circular cut of 360 degrees and the conductors exposed with longitudinal distance of around 0.24 to 0.25 inches between them, thus creating a path to form a track. The wet arc signature produced in one of the tests is shown as FIG. 1.

Figure 1:
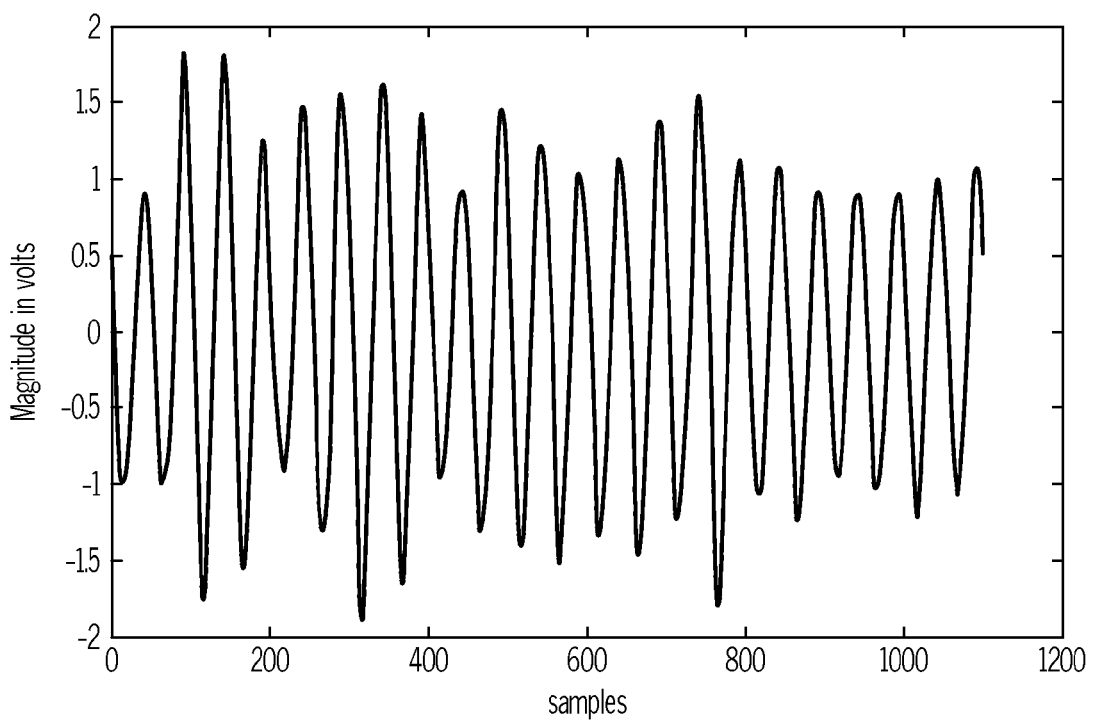
FIG. 1 is a graph shows one type of a wet arc current signature waveform detectable by embodiments describing methods of the present invention.

Various digital spectrum analyses of the wet arc fault waveform of FIG. 1 may show very small magnitude in each harmonic frequency component.

Figure 2A:
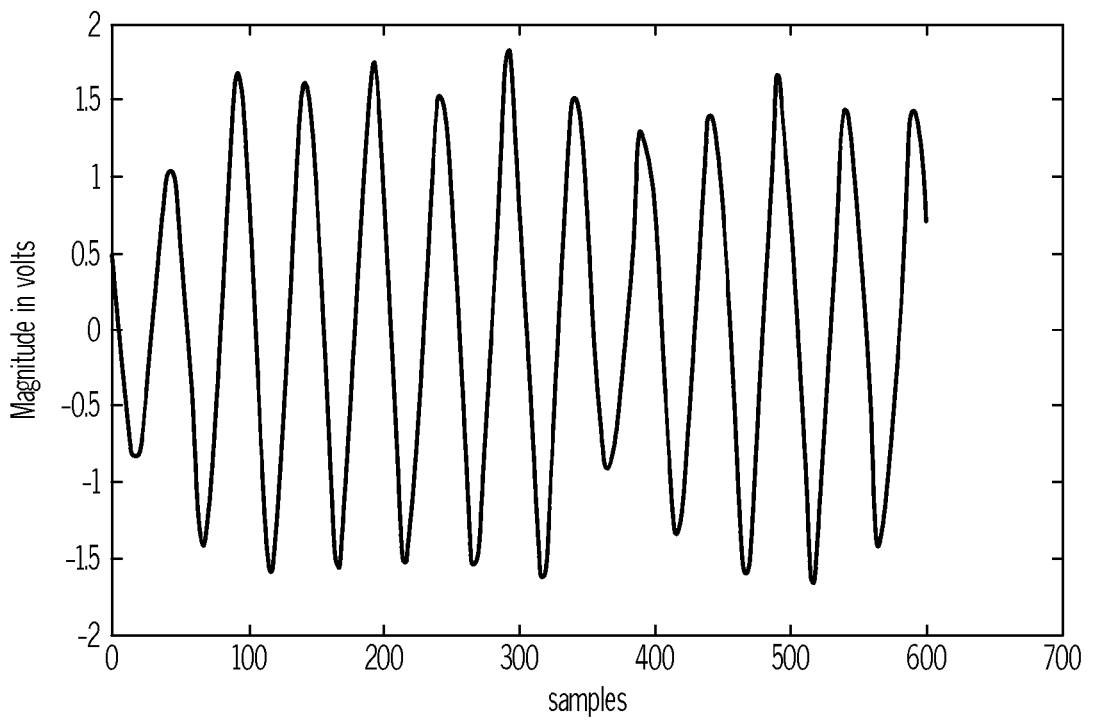
FIG. 2A is a graph showing another example of a typical wet arc current signature waveform.
Figure 2B:
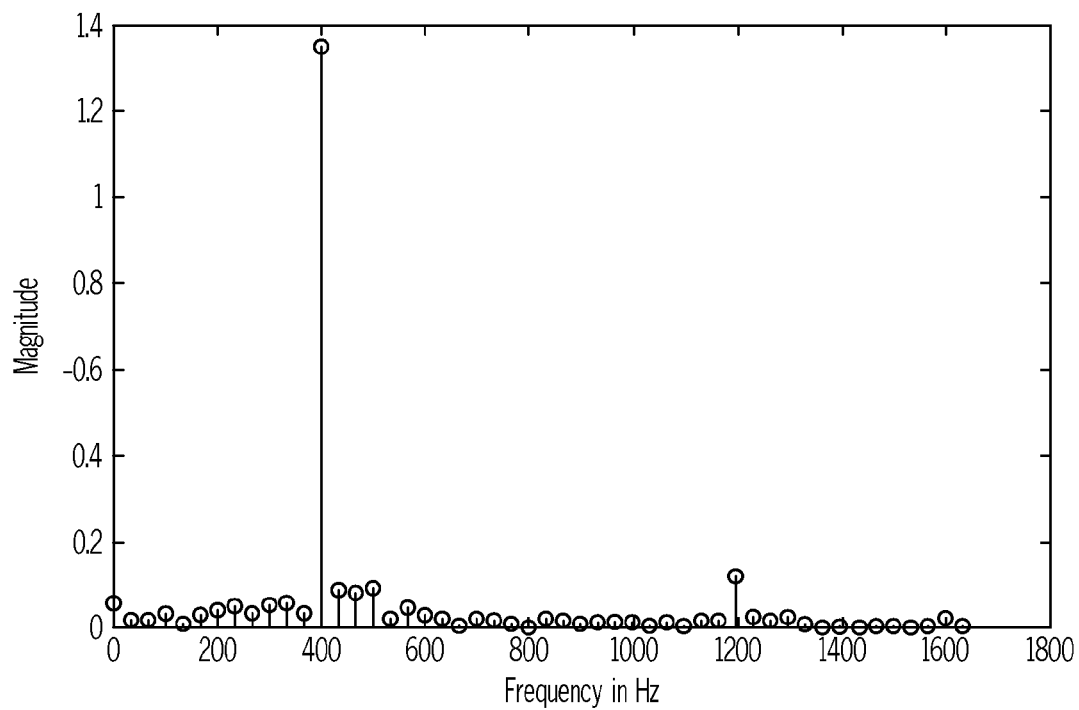
FIG. 2B is a graph showing the fast fourier transform (FFT) analysis of the typical wet arc current signature waveform of FIG. 2A.

Referring now to FIGS. 2A and 2B, there is shown another example of a typical wet arc current signature waveform along with its fast fourier transform (FFT) analysis.

The wet arc current signature FIGS. 2A and 2B shows neither significant changes in the current magnitude (in terms of peak value, for example) over time, nor significant harmonic component in the frequency domain, which makes conventional time domain and frequency domain based arc fault detection methods insensitive.

Figure 3:
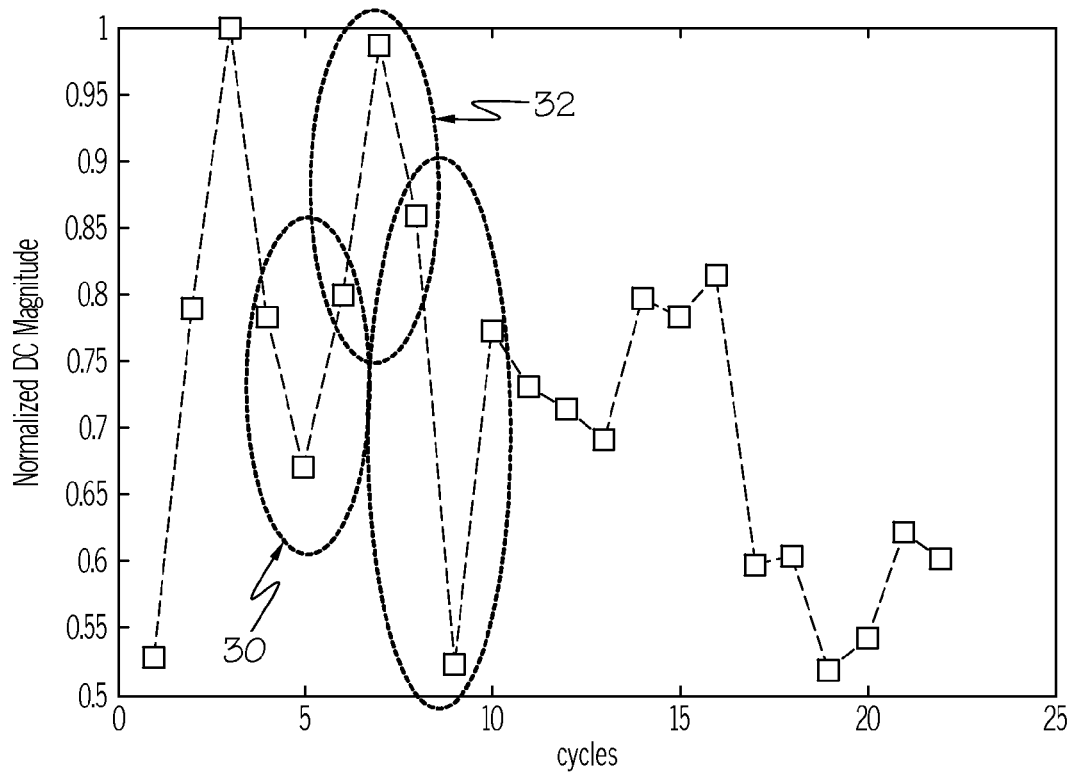
FIG. 3 is a graph showing the DC content in every AC cycle during a typical wet arc fault, with an emphasis on showing a similar change over many cycles, as may be detected according to embodiments describing methods of the present invention.

However, when the DC content within each power (or alternate current) cycle, termed as DC content per cycle, is extracted from that wet arc current signal, as shown in FIG. 3, drastic changes in the magnitude of this DC content per cycle signature can be observed.

In FIG. 3, the DC content in every alternate current cycle measured may vary from the immediate previous cycle and next cycle respectively. This change may be continuously monitored in the extracted DC signature template. These changes may be repetitive in nature. After a minimum number of times with a similar change being monitored over 20 cycles, for example, 3-4 times, a final decision may be made that the current signature is a wet arc signature.

To explain in detail, marked dotted lines show three consecutive AC alternating cycles. In the first dotted structure 30 on the left side, the DC magnitude change observed has a more positive change compared to the previous cycle DC magnitude; while the slope exhibited by DC content is more negative compared with the next immediate consecutive cycle waveform 32. Such signature change/DC change is observed multiple times in the given DC arc template. This has been observed in many similar cases when a wet arc was generated where a normal arc fault detector fails to detect wet arc signature. These changes may be found repetitive in their behavior in the given arc template and consecutive arc templates. This may provide information on the wet arc characteristics exhibiting a typical behavior, which may be detected and positively confirmed as a wet arc fault.

As mentioned above, typically, a span of about 20 AC cycles may be monitored. When the signature change/DC change described above is observed in a certain number of these 20 cycles, a wet arc fault detection may be triggered. Typically, about 3 or 4 of these signature changes/DC changes may be used to trigger the wet arc fault detection. However, this sensitivity may be changed as needed, either to higher sensitivity (for example, 2 signature changes/DC changes) for greater wet arc detection, or to lower sensitivity (for example, 5 or 6 signature changes/DC changes) for avoidance of nuisance trips.

Figure 4A:
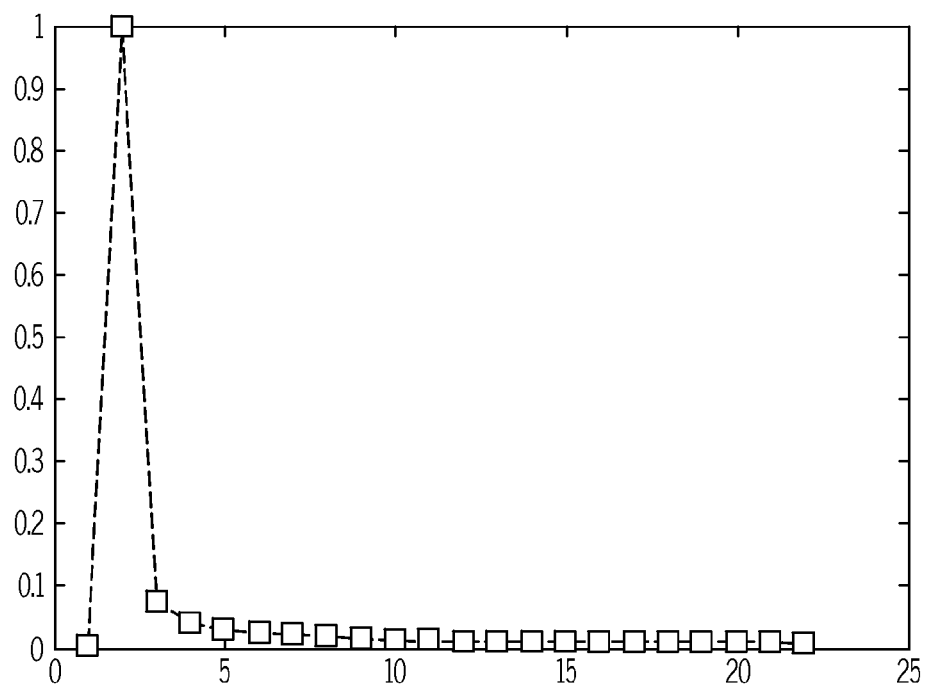
FIGS. 4A and 4B are graphs showing the DC content per cycle in normal transients which should not cause a wet arc fault detection according to embodiments describing methods of the present invention.
Figure 4B:
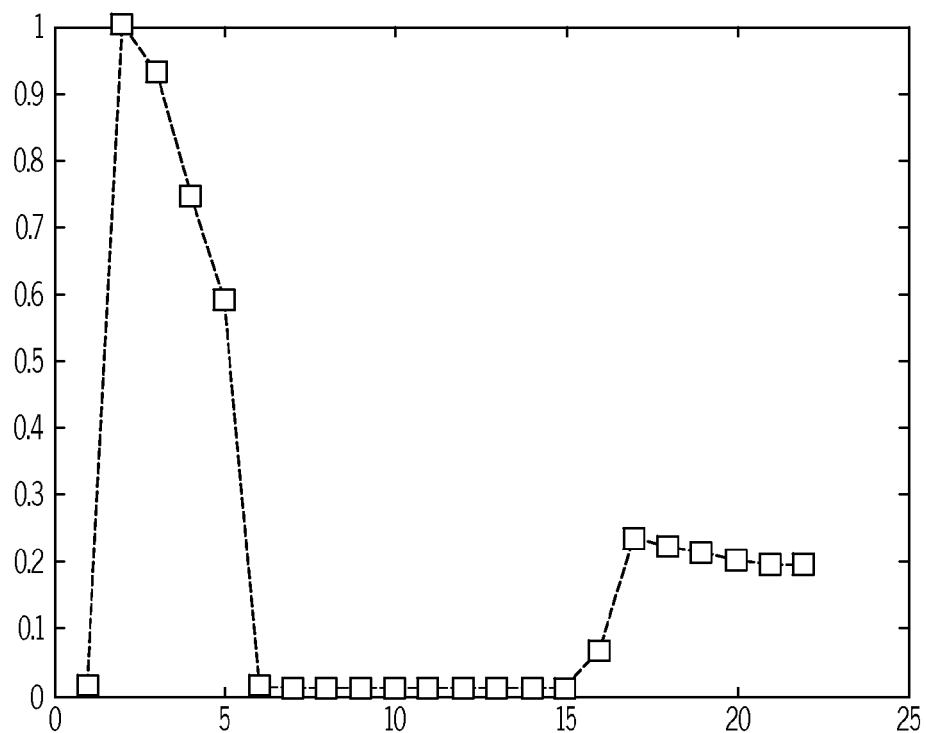

The method applied above may also be tested with transients, as shown in FIGS. 4A and 4B, which show the DC content per cycle in normal transients according to certain load test data. In each of these transient situations, the methods of the present invention do not detect a wet arc fault, thereby avoiding nuisance trips that may be caused by these transients.

Figure 5:
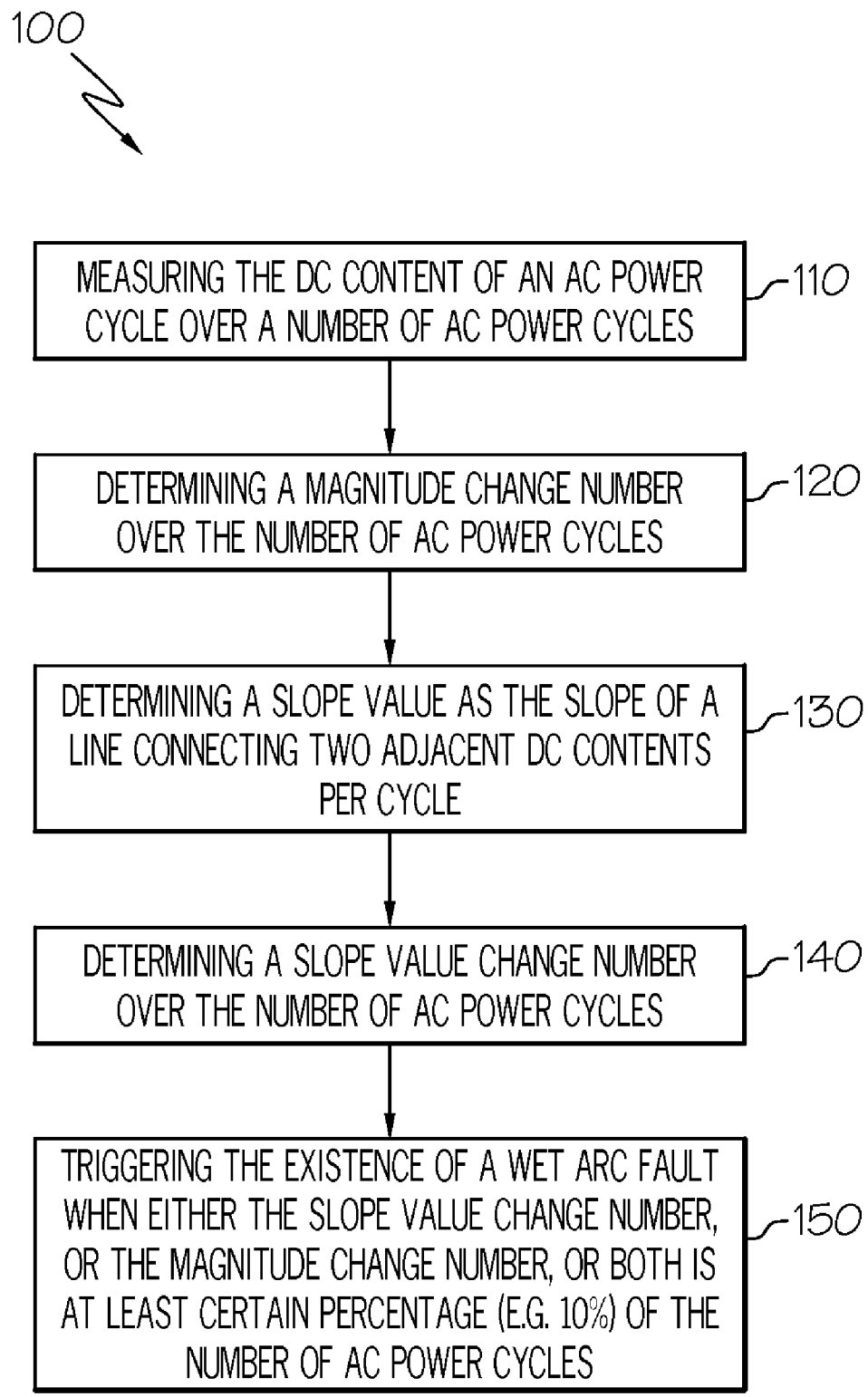
FIG. 5 is a flow chart depicting a method according to an embodiment of the present invention.

Referring to FIG. 5, there is shown a flow chart describing a method 100 according to an embodiment of the present invention. In one step 110, the DC content per cycle of an AC waveform may be measured over a certain number of AC power cycles. Typically, between about 10 and about 30 waveforms, often 20 waveforms, may be used to measure the DC content per cycle for each AC waveform. In another step 120, a magnitude change number may be determined. This magnitude change number may be described as the number of times the magnitude of the DC content per cycle changes from positive to negative and from negative to positive over the number of AC waveforms. In step 150, to trigger the existence of a wet arc fault, the magnitude change number is typically at least certain percentage (e.g. 10%, 20%, and 25%, etc.) of the number of AC power cycles. In another step 130 of the method 100, a slope value may be determined, wherein the slope value may be determined as the slope of a line connecting two adjacent DC content per cycle values. From this slope value, in step 140, a slope value change number may be determined. The slope value change number may be described as the number of times the slope value changes over the number of AC power cycles. In step 150, to determine the existence of a wet arc fault, the slope value change number is typically at least certain percentage (e.g. 10%, 20%, and 25%, etc.) of the number of AC power cycles. In one embodiment of the present invention, the magnitude change number and the slope value number may vary consecutively over a predetermined number of AC power cycles, such as, for example, over 2, 3, 4 or 5 consecutive AC power cycles. When a wet arc fault is determined, a user may be identified of such a wet arc fault. For example, when system testing, a monitor may display to a tester that there is a wet arc fault present. In aircraft applications, the pilot and/or maintenance personnel may be informed of a wet arc fault through, for example, an indicator in the cockpit of the aircraft.

While the above description focuses on solving the problem of identifying wet arcs, the methods of the present invention may also be useful for determining the presence of other types of arcs. For example, parallel arcs and serial arcs may be detected by the methods of the present invention.

It should be understood, of course, that the foregoing relates to exemplary embodiments of the invention and that modifications may be made without departing from the spirit and scope of the invention as set forth in the following claims.

We claim:

1. A method for detecting arc faults, the method comprising:

measuring a direct current (DC) content of an alternating current (AC) power cycle over a number of AC power cycles;

determining a magnitude change number, the magnitude change number being the number of times the magnitude of the DC content per cycle changes from positive to negative and from negative to positive over the number of AC waveforms; and determining the existence of the arc fault when the magnitude change number is at least a certain percentage of the number of AC power cycles.

2. The method of claim 1, wherein the arc fault is a wet arc fault.

3. The method of claim 2, further comprising:

determining a slope value, the slope value being a slope of a line connecting two adjacent DC content per cycle values when the DC content per cycle is plotted consecutively on a graph;

determining a slope value change number, the slope value change number being the number of times the slope value changes over the number of AC power cycles; and positively determining the existence of the wet arc fault when the slope value change number is at least certain percentage of the number of AC power cycles.

4. The method of claim 3, wherein the number of AC power cycles is between 10 and 30.

5. The method of claim 3, wherein the number of AC power cycles is 20.

6. The method of claim 2, wherein the existence of the wet arc fault is positively determined when the magnitude change number is at least 25% of the number of AC power cycles.

7. The method of claim 3, wherein the existence of the wet arc fault is positively determined when the slope value change number is at least 20% of the number of AC power cycles.

8. The method of claim 2, further comprising avoiding nuisance trips by falsely triggering a wet arc fault when no wet arc fault exists.

9. A method for detecting wet arc faults, the method comprising:

measuring a direct current (DC) content of an alternating current (AC) power cycle over a number of AC power cycles;

determining a slope value, the slope value being a slope of a line connecting two adjacent DC content per cycle values when the DC content per cycle is plotted consecutively on a graph;

determining a slope value change number, the slope value change number being the number of times the slope value changes over the number of AC power cycles; and determining the existence of the wet arc fault when the slope value change number is at least a certain percentage of the number of AC power cycles.

10. The method of claim 9, further comprising:

determining a magnitude change number, the magnitude change number being the number of times the magnitude of the DC content per cycle changes from positive to negative and from negative to positive over the number of AC power cycles; and positively determining the existence of the wet arc fault when the magnitude change number is at least 10% of the number of AC power cycles.

11. The method of claim 10, wherein:

wherein the existence of the wet arc fault is positively determined when the magnitude change number is at least 20% of the number of AC power cycles and when the slope value change number is at least 20% of the number of AC power cycles.

12. The method of claim 10, wherein the number of AC power cycles is between 10 and 30.

13. A method for detecting wet arc faults, the method comprising:

measuring a direct current (DC) content of an alternating current (AC) power cycles over a number of AC power cycles;

determining a slope value, the slope value being a slope of a line connecting two adjacent DC content per cycle values when the DC content per cycle is plotted consecutively on a graph;

determining a slope value change number, the slope value change number being the number of times the slope value changes over the number of AC power cycles;

determining a magnitude change number, the magnitude change number being the number of times the magnitude of the DC content per cycle changes from positive to negative and from negative to positive over the number of AC power cycles; and determining the existence of the wet arc fault when the slope value change number and the magnitude change number is at least a certain percentage of the number of AC power cycles.

14. The method of claim 13, wherein the existence of the wet arc fault is positively determined when the magnitude change number is from about 10% to about 50% of the number of AC power cycles and when the slope value change number is from about 10% to about 50% of the number of AC power cycles.

15. The method of claim 13, wherein the existence of the wet arc fault is positively determined when the magnitude change number is at least 20% of the number of AC power cycles and when the slope value change number is at least 20% of the number of AC power cycles.

16. The method of claim 13, wherein the existence of the wet arc fault is positively determined when the magnitude change number and the slope value change number vary consecutively over a predetermined number of AC power cycles.

17. The method of claim 16, wherein the predetermined number of AC power cycles is from 2 to 5.

* * * * *